United States Patent [19]

Muan et al.

[11] Patent Number: 5,102,834
[45] Date of Patent: Apr. 7, 1992

[54] VANADIUM GARNET MATERIALS IN THE MNO-CAO-V$_2$O$_3$-SIO$_2$ SYSTEM

[75] Inventors: Arnulf Muan, Lacey Spring, Va.; Mitri S. Najjar, Wappingers Falls, N.Y.

[73] Assignee: Texaco Inc., White Plains, N.Y.

[21] Appl. No.: 615,533

[22] Filed: Nov. 19, 1990

[51] Int. Cl.$^5$ .............................................. C30B 29/30
[52] U.S. Cl. ...................................... 501/86; 501/73; 252/301.4 F
[58] Field of Search .................................. 301/73, 86; 252/301.4 R

[56] References Cited

U.S. PATENT DOCUMENTS 3,360,675 12/1967 Mikus et al. ............. 252/301.4 R X
3,396,119 8/1968 Maiman et al. ........... 252/301.4 R X
4,980,320 12/1990 Najjar et al. ............. 252/301.4 R X Primary Examiner—William R. Dixon, Jr.
Assistant Examiner—Lisa M. Schull
Attorney, Agent, or Firm—Robert A. Kulason; James J. O'Loughlin; Albert Brent

[57] ABSTRACT

Vanadium garnet materials and a method for their preparation. The vanadium garnet material has a trivalent vanadium cation and a composition that falls within a specific prismatic-shaped volume in a quaternary composition diagram of MnO, CaO, V$_2$O$_3$, and SiO$_2$. The prismatic-shaped volume represents compositions of liquids with which said vanadium garnet is in equilibrium on the liquidus surface and from which the vanadium garnet phase is crystallized. A typical vanadium garnet material has the formula Mn$_{1.3}$Ca$_{1.7}$V$_2$Si$_3$O$_{12}$, as provided in the drawing by point F. The vanadium garnet materials may be used in laser applications.

3 Claims, 1 Drawing Sheet

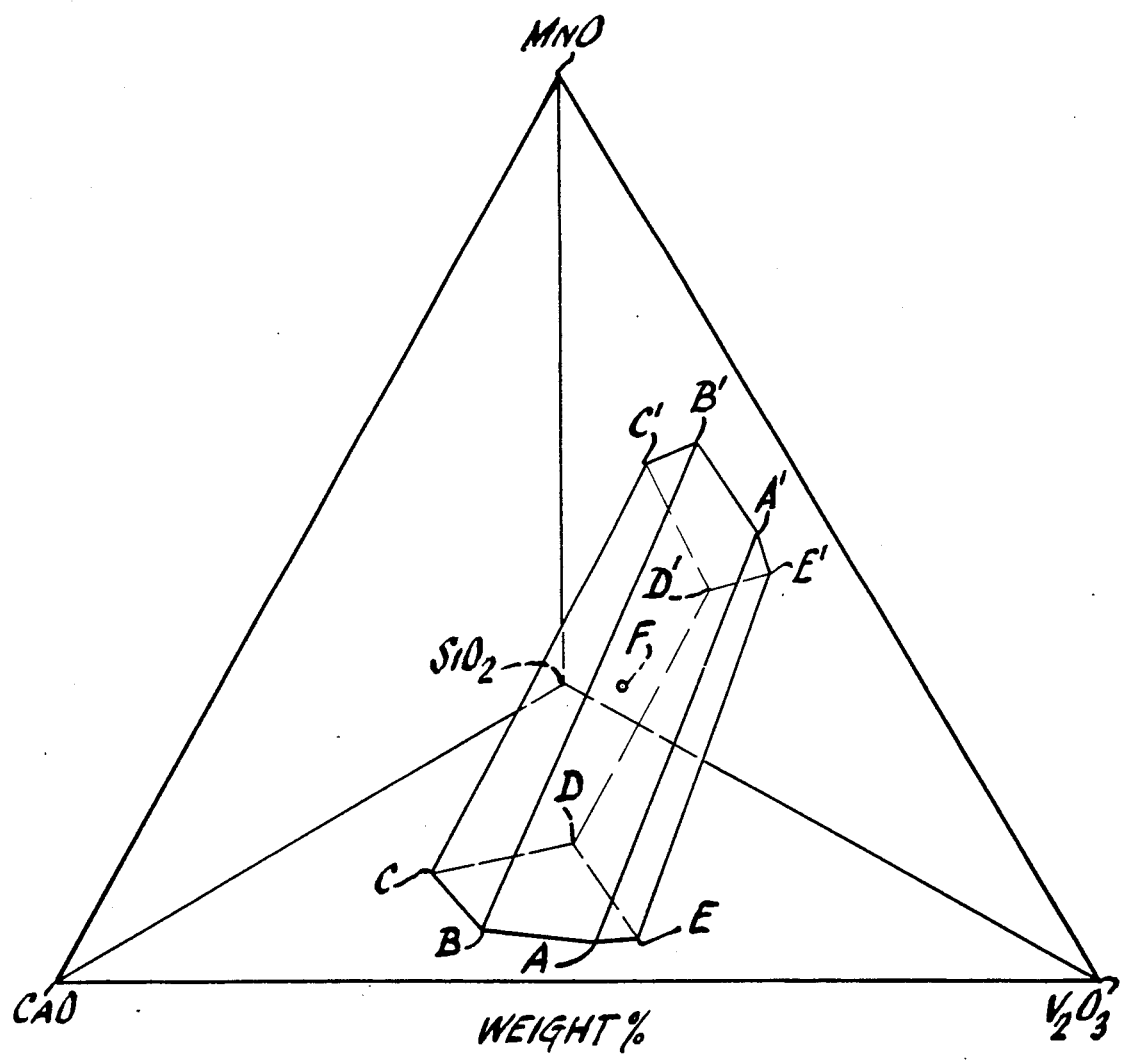

VANADIUM GARNET MATERIALS IN THE MNO-CAO-$V_2O_3$-$SIO_2$ SYSTEM

BACKGROUND OF THE INVENTION

Field of the Invention

This invention relates to vanadium garnet materials in the MnO—CaO—$V_2O_3$—$SiO_2$ system.

SUMMARY OF THE INVENTION

The present invention pertains to vanadium garnet materials and a method for their preparation. The material comprises vanadium garnet containing vanadium in the trivalent state. For example, point F in the drawing corresponds to the formula $Mn_{1.3}Ca_{1.7}V_2Si_3O_{12}$ and falls within a volume of a quaternary composition diagram of MnO, CaO, $V_2O_3$, and $SiO_2$. The material falling within said volume represents compositions of liquids within the quaternary system MnO—CaO—$V_2O_3$—$SiO_2$ with which said vanadium garnet phase is in equilibrium and from which the garnet phase is crystallized. The volume may be represented as a prism with vertices and corresponding coordinates in weight percent as shown in Table I.

TABLE I

| Vertices | Coordinates (wt %) | | | |
|---|---|---|---|---|
| | MnO | CaO | $V_2O_3$ | $SiO_2$ |
| A | 1 | 41 | 45 | 13 |
| B | 1 | 49 | 32 | 18 |
| C | 1 | 44 | 17 | 38 |
| D | 1 | 25 | 27 | 47 |
| E | 1 | 36 | 48 | 15 |
| A' | 41 | 1 | 36 | 22 |
| B' | 49 | 1 | 25 | 25 |
| C' | 42 | 1 | 15 | 42 |
| D' | 22 | 1 | 32 | 45 |
| E' | 36 | 1 | 37 | 26 |

A method of preparing a vanadium garnet material in the MnO, CaO, $V_2O_3$, and $SiO_2$ system, wherein said vanadium garnet is crystallized from a melt with which said vanadium garnet material is in equilibrium on the liquidus surface, and wherein the melt has a composition that falls within a prismatic-shaped volume ABCDEA'B'C'D'E' as shown in the disclosed figure for a quaternary composition diagram of MnO, CaO, $V_2O_3$, and $SiO_2$ comprising the steps of:

(1) heating $V_2O_5$ powder having a particle size of less than about 50 microns in an atmosphere in which the partial pressure of oxygen is in the range of $10^{-5}$ to $10^{-10}$ atmosphere and the $CO_2/H_2$ volume ratio is in the range of about 10/1 to 1/1 while gradually increasing the temperature over a temperature range of about 600° C. to 1300° C. and holding the temperature at about 1300° C. for a period of at least about 24 hrs. to ensure complete reduction of all vanadium to $V^{3+}$;

(2) heating MnO, CaO, and $SiO_2$ powders each having a particle size of less than about 50 microns for a period of about 10 to 14 hrs. at a temperature in the range of about 1000° C. to 1400° C.;

(3) thoroughly grinding together an amount of $V_2O_3$ from (1) in the range of about 15 to 45 wt.%, with an amount of MnO from (2) in the range of about 1 to 49 wt.%, and an amount of CaO in the range of about 1 to 49 wt.%, and an amount of $SiO_2$ from (2) in the range of about 13 to 47 wt.% to produce a mixture having a grain size of less than about 50 microns;

(4) pelletizing the mixture from (3) at a pressure of about 5,000 psi;

(5) heating the pellets from (4) at a temperature in the range of about 1100° C. to 1400° C. for a period in the range of about 12 to 48 hrs. in an atmosphere in which the partial pressure of oxygen is in the range of $10^{-10}$ to $10^{-5}$ atmosphere to produce a melt; and (6) cooling the material from (5) and crystallizing out said vanadium garnet material, and separating said vanadium garnet material from the rest of the melt.

BRIEF DESCRIPTION OF THE DRAWING

The drawing depicts a quaternary composition diagram of MnO, CaO, $V_2O_3$, and $SiO_2$ showing a prismatic-shaped volume representing liquid compositions which are in equilibrium with vanadium garnet material in the liquidus volume and from which the vanadium garnet phase is crystallized.

DESCRIPTION OF THE INVENTION

Vanadium garnet materials have been synthesized by the subject invention in which garnet material involving trivalent vanadium cation as a component have been characterized. The garnet phases synthesized are thermodynamically stable over a wide range of oxygen pressures e.g., about $10^{-5}$ to $10^{-12}$ atmospheres, and at elevated temperatures, e.g. up to about 1000° C.

The newly synthesized vanadium garnet materials produced from MnO—CaO—$V_2O_3$—$SiO_2$ have compositions that fall within a prismatic-shaped volume in the quaternary composition diagram in the drawing, wherein the prismatic-shaped volume represents compositions of liquids with which said vanadium garnet is in equilibrium in the liquidus volume and from which said garnet phase is crystallized. The oxidation state of vanadium in the garnet material is mainly +3.

The polygon shaped shaded area has the following vertices and corresponding coordinates in weight percent:

| Vertices | Coordinates (wt %) | | | |
|---|---|---|---|---|
| | MnO | CaO | $V_2O_3$ | $SiO_2$ |
| A | 1 | 41 | 45 | 13 |
| B | 1 | 49 | 32 | 18 |
| C | 1 | 44 | 17 | 38 |
| D | 1 | 25 | 27 | 47 |
| E | 1 | 36 | 48 | 15 |
| A' | 41 | 1 | 36 | 22 |
| B' | 49 | 1 | 25 | 25 |
| C' | 42 | 1 | 15 | 42 |
| D' | 22 | 1 | 32 | 45 |
| E' | 36 | 1 | 37 | 26 |

A typical newly synthesized vanadium garnet material having the formula $Mn_{1.3}Ca_{1.7}Si_3O_{12}$ is illustrated by point F in the drawing having the following coordinates in wt.%: MnO 19, CaO 19, $V_2O_3$ 30, and $SiO_2$ 32. It appears as beautiful euhedral crystals in equilibrium with liquids.

It is to be noted that the vanadium garnet appears as a primary phase in the liquidus volume of the system, MnO—CaO—$V_2O_3$—$SiO_2$. Accordingly, the growing of single crystals of this material is relatively simple, provided that atmospheric control of the type used in the synthesis procedure described herein is maintained during the crystal growing process. By the subject process, larger and better e.g. purer vanadium-containing garnet crystals are grown. The size of these crystals are in the range of about 2 to 100 microns.

Quaternary compounds in the MnO—CaO—$V_2O_3$—$SiO_2$ system are synthesized in the following manner. First, $V_2O_3$ is prepared by heating commercially available analytical-grade $V_2O_5$ having a particle size of less than about 50 microns in a vertical tube furnace in an atmosphere of carefully selected oxygen pressure within the stability range of $V_2O_3$ e.g. in the range of $10^{-5}$ to $10^{-10}$ atmospheres. This is accomplished by using a gas mixture of high-purity $CO_2$ and $H_2$ in controlled proportions. The $CO_2/H_2$ ratio by volume is in the range of 10/1 to 1/1. The relatively low melting point of the starting vanadium oxide ($V_2O_5$), e.g. about 690° C., necessitates heating the oxide slowly. Starting at a temperature of about 600° C., the temperature is gradually increased over a period of about 12 to 24 hrs. to a final temperature of about 1300° C. At a temperature of about 1300° C. the vanadium oxide is held at least about 24 hrs. e.g. 24 to 30 hrs. to ensure complete reduction of all vanadium to $V^{3+}(V_2O_3)$.

Pre-heated analytical-grade oxides having a particle size of less than about 50 microns are used as starting materials for the other components of the garnet phase to be synthesized. For example, MnO, CaO and $SiO_2$ are heated for about 10 to 14 hrs. at a temperature in the range of about 1000° C. to 1400° C. prior to being used in preparation of the final mixtures.

The mixtures of the four oxide components are mechanically ground together under acetone in an agate mortar to ensure thorough mixing and a sufficiently small grain size e.g. less than 50 microns. For example, a specific amount of $V_2O_3$ in the range of about 15 to 45 wt.% is ground together with MnO in the range of about 1 to 49 wt.%, and an amount of CaO in the range of about 1 to 49 wt.%, and $SiO_2$ in the range of about 13 to 47 wt.% to produce a mixture having a grain size of less than about 50 microns. Complete formation of the desired compounds in the heat treatment step is thereby promoted. The oxide mixtures are pelletized at a pressure of about 5,000 psi or higher. The pellets may have any conventional size e.g. 1/16" to 1". The pellets are then heated at a temperature in the range of about 1100° C. to 1400° C. for a period in the range of about 12 to 48 hrs. in a vertical tube furnace with carefully controlled oxygen pressures, and in the range of $10^{-10}$ to $10^{-5}$ atmosphere to produce a melt. In the manner described previously for preparing $V_2O_3$, the pellets are heated in a furnace atmosphere provided by a gas mixture of $CO_2$ and $H_2$ in various desired mixing ratios, typically in the range of about 10/1 to 1/1. These selected ratios are kept constant for the duration of the synthesis by use of a differential manometer. By this method the oxygen pressure at the specified temperature can be controlled to better than ±1%. The thermodynamic data for the water-gas reaction ($CO_2 + H_2 = CO + H_2O$), on which the calculations were based, are known with extremely high accuracy (better than 0.1%), and hence the method used ensures reliable accurate control of the oxidation state of vanadium during the synthesis. This is extremely important for optimization of the properties of the finished product.

The molten material from the furnace is cooled to a temperature which is above the freezing point of the rest of the melt e.g., above about 1100° C. The cooling takes place over a period in the range of about 1 to 12 hours while at substantially the same partial pressure of oxygen as that in the furnace. The vanadium garnet material will thereby crystallize out from the melt and may be separated by conventional means from the rest of the liquid melt, such as by decanting. The identity of the stable solid compositions produced from MnO—CaO—$V_2O_3$—$SiO_2$ may be confirmed by x-ray diffraction analysis.

The vanadium garnet material involving MnO—CaO—$V_2O_3$—$SiO_2$ may be used in laser applications, offering greater stability over a wider temperature range e.g. about 1000° C. or higher than that which is offered by typical laser materials.

Various modifications of the invention as herein before set forth may be made without departing from the spirit and scope thereof, and therefore, only such limitations should be made as are indicated in the appended claims.

We claim:

1. A vanadium garnet material in the MnO—CaO—$V_2O_3$—$SiO_2$ system, wherein the volume circumscribed by ABCDEA'B'C'D'E' as shown in the disclosed Figure for a quaternary composition diagram of MnO, CaO, $V_2O_3$, and $SiO_2$ represents compositions of liquids with which said vanadium garnet is in equilibrium in the liquidus volume and from which said vanadium garnet material is crystallized, and wherein the amounts of MnO, CaO, $V_2O_3$, and $SiO_2$ are characterized as shown in the table below:

| Vertices | Coordinates (wt %) | | | |
|---|---|---|---|---|
| | MnO | CaO | $V_2O_3$ | $SiO_2$ |
| A | 1 | 41 | 45 | 13 |
| B | 1 | 49 | 32 | 18 |
| C | 1 | 44 | 17 | 38 |
| D | 1 | 25 | 27 | 47 |
| E | 1 | 36 | 48 | 15 |
| A' | 41 | 1 | 36 | 22 |
| B' | 49 | 1 | 25 | 25 |
| C' | 42 | 1 | 15 | 42 |
| D' | 22 | 1 | 32 | 45 |
| E' | 36 | 1 | 37 | 26. |

2. A vanadium garnet material as provided in claim 1 having the formula $Mn_{1.3}Ca_{1.7}V_2Si_3O_{12}$ as illustrated by point F in said quaternary composition diagram and having the following coordinates in wt.%: MnO 19, CaO 19, $V_2O_3$ 30, and $SiO_2$ 32.

3. A laser material in the MnO—CaO—$V_2O_3$—$SiO_2$ system, wherein the volume circumscribed by ABCDEA'B'C'D'E' as shown in the disclosed Figure represents compositions of liquids with which said laser material is in equilibrium in the liquidus volume and from which said laser material is crystallized, and wherein the amounts of MnO, CaO, $V_2O_3$, and $SiO_2$ are characterized as shown in the table below:

| Vertices | Coordinates (wt %) | | | |
|---|---|---|---|---|
| | MnO | CaO | $V_2O_3$ | $SiO_2$ |
| A | 1 | 41 | 45 | 13 |
| B | 1 | 49 | 32 | 18 |
| C | 1 | 44 | 17 | 38 |
| D | 1 | 25 | 27 | 47 |
| E | 1 | 37 | 49 | 15 |
| A' | 41 | 1 | 36 | 22 |
| B' | 49 | 1 | 25 | 25 |
| C' | 42 | 1 | 15 | 42 |
| D' | 22 | 1 | 32 | 45 |
| E' | 36 | 1 | 37 | 26. |

* * * * *